United States Patent [19]

Yamada et al.

[11] Patent Number: 4,962,423
[45] Date of Patent: Oct. 9, 1990

[54] MARK DETECTING METHOD AND APPARATUS

[75] Inventors: Yuichi Yamada, Kawasaki; Naoki Ayata, Machida; Hiroki Suzukawa, Yokohama; Hideki Nogawa, Tokyo, all of Japan

[73] Assignee: Canon Kabushiki Kaisha, Tokyo, Japan

[21] Appl. No.: 301,367

[22] Filed: Jan. 25, 1989

[30] Foreign Application Priority Data

Jan. 27, 1988 [JP] Japan .............................. 63-014526

[51] Int. Cl.$^5$ .............................................. H04H 7/18
[52] U.S. Cl. ...................................... 358/101; 382/30; 382/8; 358/107
[58] Field of Search ................. 358/101, 107, 106, 93; 382/8, 30, 32; 356/248

[56] References Cited

U.S. PATENT DOCUMENTS

| | | | |
|---|---|---|---|
| 4,475,122 | 10/1984 | Green | 358/101 |
| 4,557,599 | 12/1985 | Zimring | 358/101 X |
| 4,634,876 | 1/1987 | Ayata | 250/548 |
| 4,641,257 | 2/1987 | Ayata | 364/559 |
| 4,655,599 | 4/1987 | Ayata et al. | 356/401 |
| 4,713,784 | 12/1987 | Ayata | 364/559 |

Primary Examiner—James J. Groody
Assistant Examiner—Victor R. Kostak
Attorney, Agent, or Firm—Fitzpatrick, Cella, Harper & Scinto

[57] ABSTRACT

Mark detecting method and apparatus usable, for example, in a semiconductor exposure apparatus such as a stepper for printing a pattern of a reticle upon a semiconductor wafer, for detecting, by using an image sensor, an alignment mark provided on a reticle or wafer for alignment of the same. Plural search marks are provided two-dimensionally around the alignment mark, each search mark having a first pattern and one or more second patterns indicative of the position of the alignment mark. When at least one first pattern of the search mark is caught by an image pickup device, the reticle is displaced in accordance with the positional information as indicated by the second pattern of the search mark. This brings the alignment mark within the image pickup region of the image sensor. The alignment mark is subsequenlty used to accurately align the reticle with a predetermined position. Thus, the time required for completing the reticle alignment can be reduced remarkably.

15 Claims, 8 Drawing Sheets

MARK DETECTING METHOD AND APPARATUS

FIELD OF THE INVENTION AND RELATED ART

This invention relates to a mark detecting method and apparatus suitably applicable to the detection of a mark. More particularly, the invention is concerned with a mark detecting method and apparatus, conveniently usable, for example, in a process of manufacturing high-density integrated circuit chips such as semiconductor memories, computing devices and the like, particularly upon detection of the position of a reticle or a wafer in a circuit pattern printing process, for detecting a mark formed on such a reticle or wafer.

An example of a mark detecting method applicable to such mark detection is disclosed in U.S. Pat. No. 4,475,122 entitled "Automatic Wafer Alignment Method", assigned to TRE Semiconductor Equipment Corporation. According to this proposal, as illustrated in the flow chart of FIG. 8, if an alignment mark to be detected is not found within a detection range (TV picture field), a wafer stage is displaced by a certain amount and TV image pickup as well as discrimination of the presence/absence of a mark are executed again. This is repeated, such that the search for the mark is continued until the mark appears within the picture field.

SUMMARY OF THE INVENTION

According to the above-identified proposal, however, the search has to be made while moving the wafer stage in a blind-feeding manner. Therefore, there is a good possibility that the time for the search is prolonged with a disadvantageous result of reducing the throughput with regard to the mark detection.

It is accordingly an object of the present invention to, in a system for detecting a predetermined mark provided on an object, reduce in time for the search of the mark as well as to improve the throughput.

In order to achieve this object, in one aspect the present invention provides a mark detecting method and apparatus wherein a first mark comprising a first particular pattern and a group of second marks each comprising a second particular pattern and bearing positional information indicative of the positional relationship between it and the first mark, are preparatorily formed on an object. For detection of the first mark by using an image pickup means, when any one of the second marks is detected, the positional information that the detected second mark bears is used, such that on the basis of the positional information the first mark is detected.

With this structure, detection of any one of second marks (provided on an object) through an image pickup means simply results in detection of such information that the detected second mark bears and that is indicative of the positional relationship between the first mark and the detected second mark. On the basis of the detected positional information, the location of the first mark can be easily detected.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 is a block diagram of a portion of the FIG. 2 exposure apparatus, for executing image processing and the like.

DESCRIPTION OF THE PREFERRED EMBODIMENTS

Figure 1:
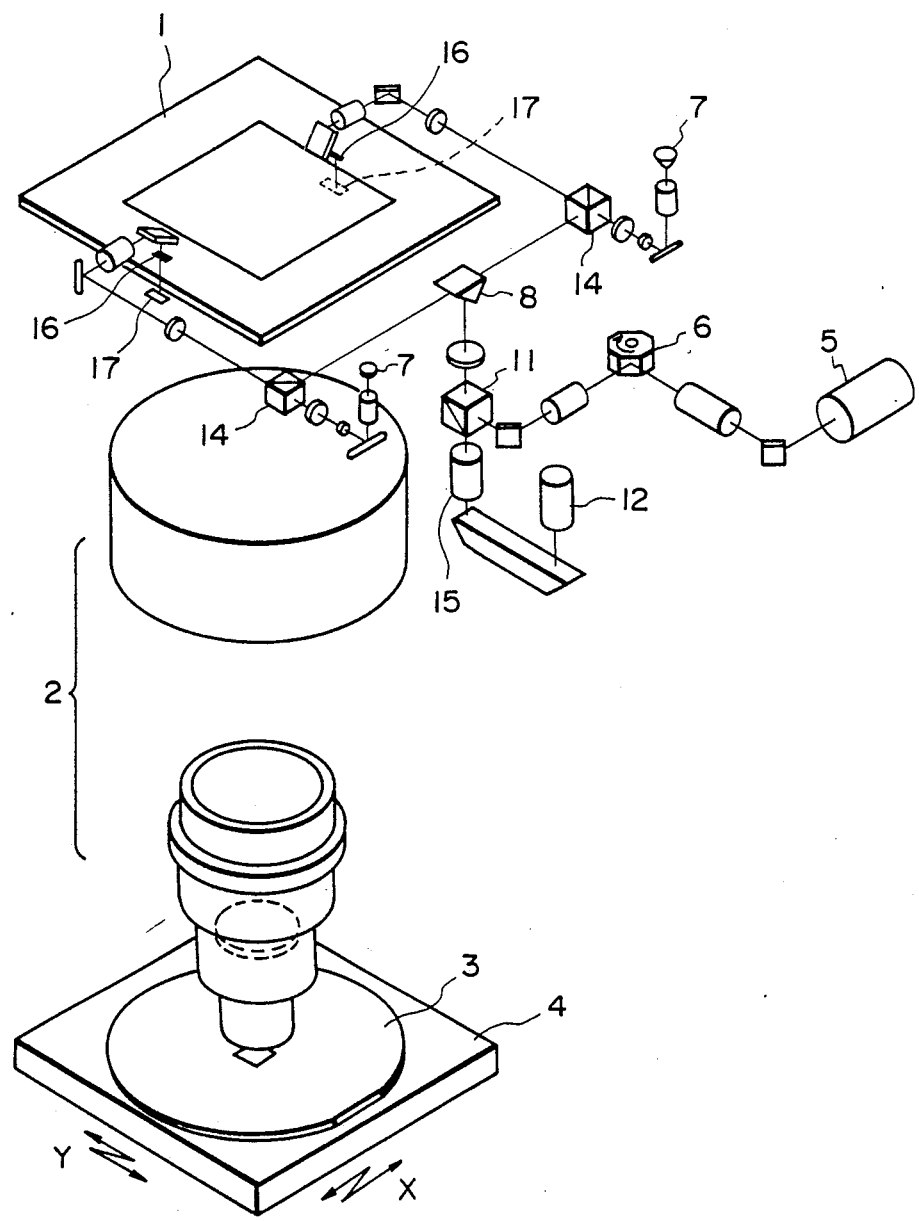
FIG. 1 is a schematic view of an optical arrangement, in the case where a mark detecting method and apparatus according to an embodiment of the present invention is applied to the alignment of the reticle in a semiconductor device manufacturing exposure apparatus.

Referring first to FIG. 1, there is schematically shown an optical arrangement, in the case where a mark detecting method and apparatus according to an embodiment of the present invention is applied to the alignment of a reticle in a semiconductor device manufacturing exposure apparatus.

In FIG. 1, a laser beam as produced by a laser producing device 5 goes to a polygonal mirror 6 by way of a mirror and a lens. The polygonal mirror 6 is rotatable at a predetermined angular speed, such that the laser beam is scanningly deflected thereby. The scanning laser beam being deflected by the polygonal mirror 6 is reflected by a beam splitter 11 and then is divided by a roof prism 8 into two which advance along two, left and right paths. Each of the split scanning laser beams is reflected by a beam splitter 14 and, after passing through or being reflected by an objective lens, an objective mirror, etc., it impinges upon a reticle alignment mark 16 provided on a reticle 1, whereby it is scanned by the laser beam. Further, the light passing through the reticle 1 impinges on a reticle setting mark 17 which is fixedly provided on a stationary portion of the exposure apparatus such as a barrel of a projection lens system 2, for example.

The lights reflected from the left and right reticle alignment marks 16 and the left and right reticle setting marks 17 go backwardly along their oncoming paths and enter into the beam splitters 14. After passing the beam splitters, the lights are received by photodetectors (photodiodes) 7. At the same time, portions of the lights from these reticle alignment marks 16 and reticle setting marks 17 are reflected by the beam splitters 14 and, after being deflected by the roof prism 8, they enter into and pass through the beam splitter 11. Finally, they pass through an erector 15 (whose magnification is changeable between a low magnification and a high magnification) as well as an elongated prism and are received by a CCD camera 12, such that images of the marks 16 and 17 are formed upon an image pickup surface of the camera 12.

It will be readily understood from the foregoing that the images of the reticle alignment marks 16 provided on the reticle 1 and the reticle setting marks 17 fixedly provided on the stationary portion of the exposure apparatus can be taken by the CCD camera 12 as imagewise information in which left-hand and right-hand mark images are combined. Further, the intensity of the reflected light from a mark upon irradiation of the same with the scanning laser beam can be detected by the photodetector 7.

Figure 2:
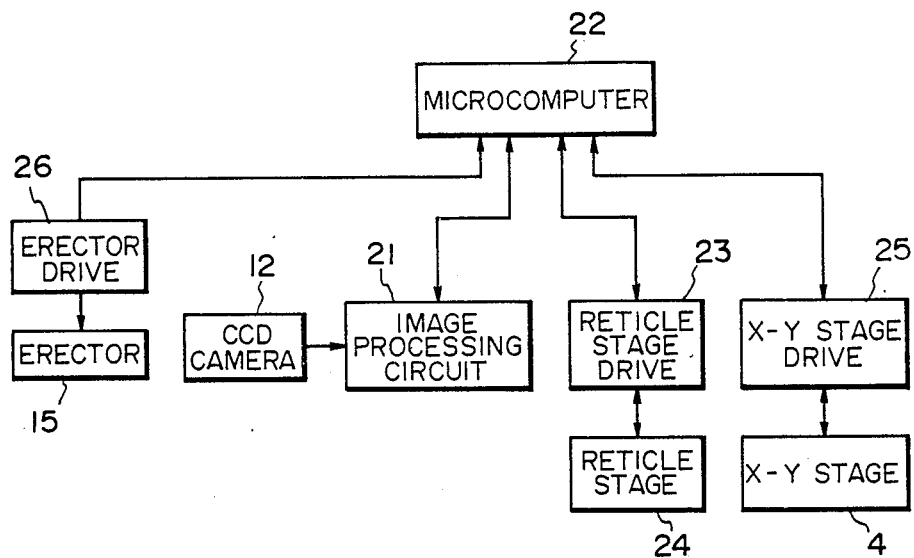

FIG. 2 is a block diagram of a portion of the semiconductor device manufacturing exposure apparatus of the FIG. 1 example, which portion is arranged to execute the image processing and the like.

In FIG. 2, denoted at 21 is an image processing circuit which is adapted to process the video signals applied thereto from the CCD camera 12, for calculation of any deviation of a mark or for other purposes; denoted at 22 is, a microcomputer which plays the role of controlling the exposure apparatus as a whole; denoted at 23 is, a reticle stage driving circuit for moving a reticle stage 24, holding thereon a reticle 1, in accordance with an instruction signal applied thereto from the microcomputer 22. Denoted at 25 is an X-Y stage driving circuit for actuating an X-Y stage 4, carrying thereon a wafer 3, in accordance with an instruction signal supplied from the microcomputer 22. Denoted at 26 is an erector actuating circuit which is operable to interchange the magnification of the erector 15 on the basis of an instruction signal supplied from the microcomputer 22.

Figure 3:
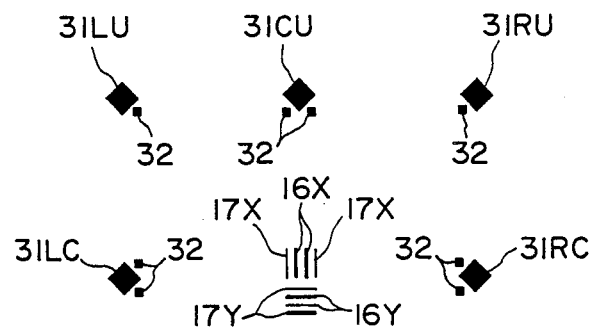
FIG. 3 is an enlarged view of a reticle setting mark and a reticle alignment mark.

FIG. 3 is an enlarged view showing details of a reticle setting mark 17 and a reticle alignment mark 16 used in the FIG. 1 example. The reticle setting mark 17 which is provided at a predetermined position on a stationary portion of the semiconductor device manufacturing exposure apparatus comprises mark elements 17X for alignment of the position of the reticle 1 in an X direction (horizontal direction in FIG. 3) as well as mark elements 17Y for alignment of the same in a Y direction (longitudinal direction in FIG. 3). On the other hand, the reticle 1 is provided with alignment mark elements 16X for the alignment in the X direction and alignment mark elements 16Y for the alignment in the Y direction. Additionally, in a portion of the reticle around these mark elements, there are provided a plurality of reticle search marks 31. In this embodiment, there are provided eight reticle search marks 31 which are formed about the reticle alignment mark 16 equidistantly from each other in a grid-like fashion. For convenience in explanation, reference characters 31LU, 31CU, 31RU, 31LC, 31RC, 31LD, 31CD and 31RD are assigned to these reticle search marks, respectively, as illustrated. These search marks 31 have the same lozenge or diamond shape, in this embodiment. Each reticle search mark 31 is formed with one or two index element marks 32 bearing specific positional information. On the basis of such positional information, as provided by the position and number of the mark or marks 32, the distance and direction from that reticle search mark 31 to the reticle alignment mark 16 is detectable.

FIG. 4 is an exemplary schematic representation of pictures as can be taken by the CCD camera 12 in the process of mark detection using the arrangement shown in FIGS. 1 and 2. Part (a) of FIG. 4 illustrates, as an example, the whole picture as taken by the CCD camera 12 at a time just after completion of the reticle feeding. Part (b) of Figure 4 illustrates, as an example, a left or right half field of the picture at a time when, after the finding of a search mark, the field division (which will be described later) is going to be executed. Part (c) of FIG. 4 is similar to the part (b) but illustrates a half field at a time after deviation correction is made on the basis of the positional information provided by the search mark. Part (d) of FIG. 4 is similar to the part (b) but illustrates a picture when the magnification is changed to a high magnification for more exact alignment purposes.

Figure 4A:
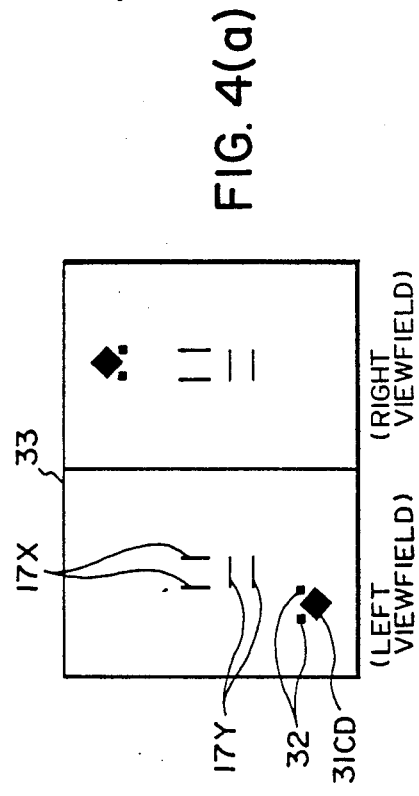
FIG. 4A-4B are schematic views illustrating a picture as taken by a CCD camera.
Figure 4D:
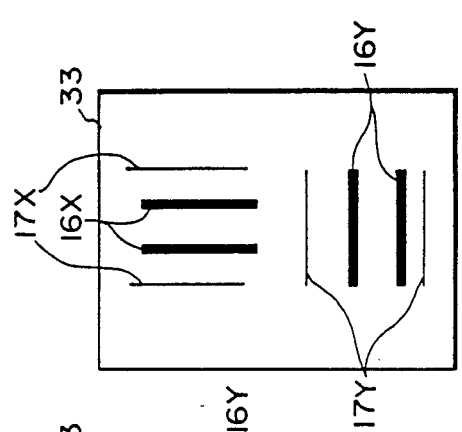
Figure 4C:
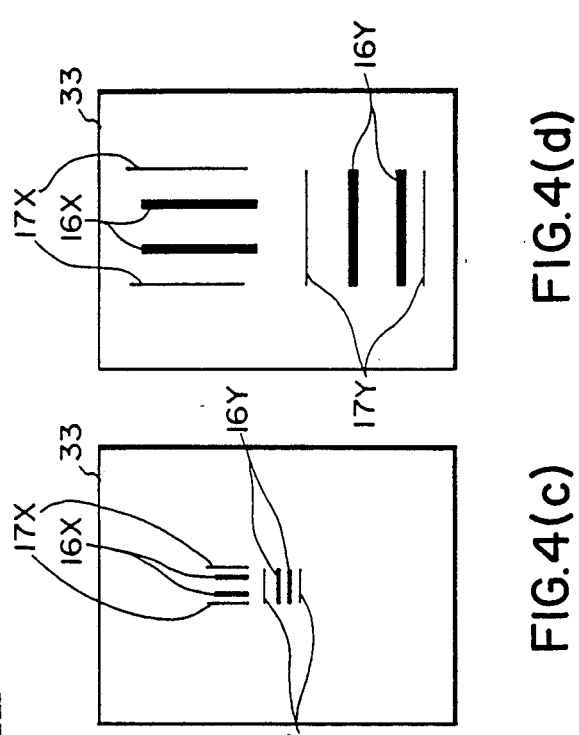
Figure 4B:
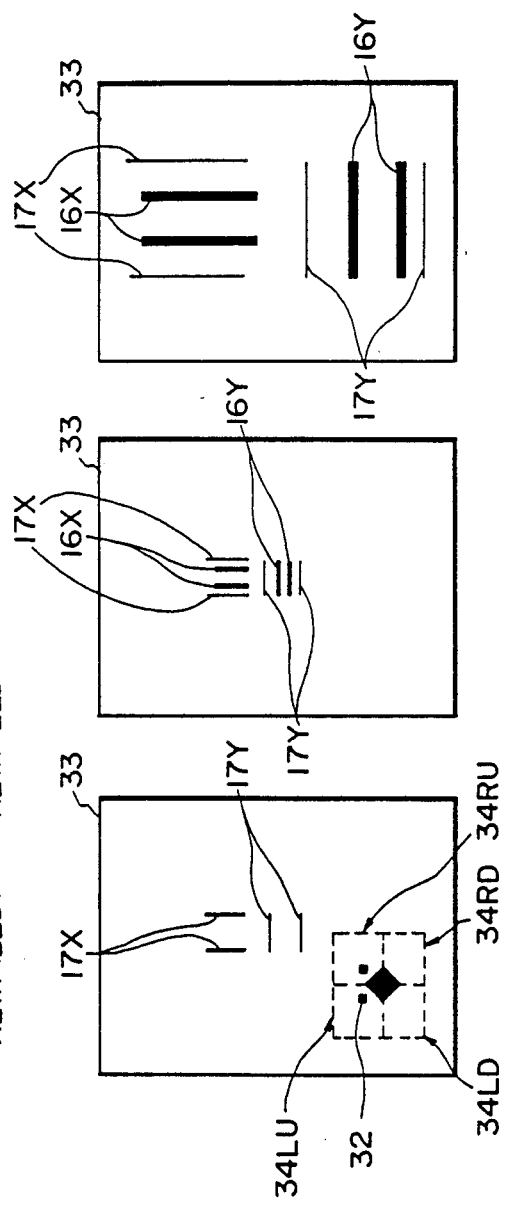
Figure 5:
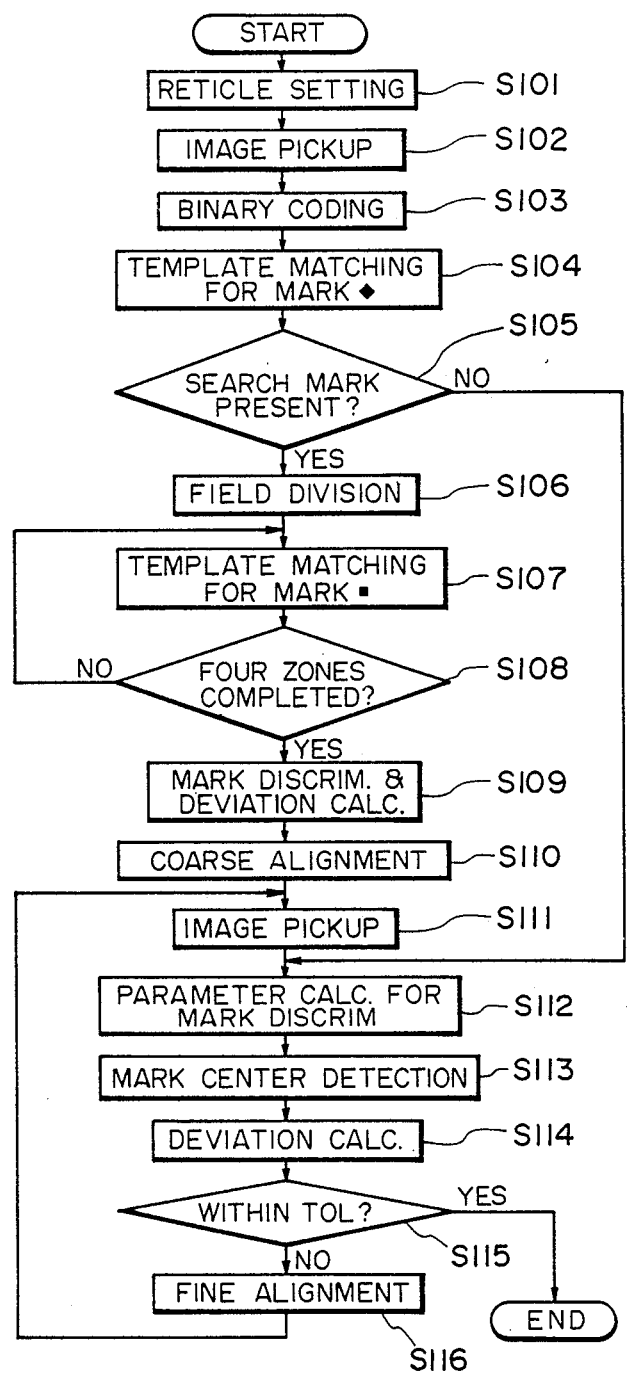
FIG. 5 is a flow chart for explicating the procedure of mark detection.

Referring to the illustrations given in FIG. 4 as well as the flow chart of FIG. 5, the process of mark detection in the apparatus of the present embodiment will now be explained. By way of example, a description will first be provided of a case where a reticle alignment mark 16 (first mark) is to be detected with the structure shown in FIGS. 1 and 2. In this example, the optical arrangement and a reticle setting mark 17 (FIG. 1) are made immovable. On the other hand, a reticle 1 after it is introduced into the exposure apparatus is held by the reticle stage 24 so that it is displaceable under the influence of the reticle stage driving circuit 23. Also, in this example, the magnification of the erector 15 is not changed but is held fixed.

First, upon the start of the mark detection process, the reticle 1 is placed on the reticle stage 24 (step S101). Then, at step S102, image pickup is made by the CCD camera 12 with the cooperation of the optical system shown in FIG. 1. As a result, the image data of a picture such as illustrated in FIG. 4(a), for example, is supplied to the image processing circuit 21. In the part (a) of FIG. 4, reference numeral 33 denotes the frame as taken by the CCD camera 12 and, in this example, reticle setting marks 17X and 17Y as well as a reticle search mark 31CD are caught. It is to be noted that the size of the frame 33 of the CCD camera 12 and the locations of all the reticle search marks 31, for example, are preparatorily and suitably set, while taking into account the mechanical precision for the feeding of the reticle 1 onto the reticle stage 24, so as to assure that, at the initial image pickup to be made just after the reticle setting, an image of a reticle alignment mark 16 or at least one reticle search mark 31 is taken up.

The introduced image data is binary-coded at step S103 and then, at step S104, template matching is made within the microcomputer 22 to search out a reticle search mark 31 in the binary-coded image data. If no search mark is found, it implies that the reticle alignment mark 16 is present within the image taken by the camera and, for this reason, the sequence branches from step S105 to step S112 for execution of fine alignment. If a search mark is present, the sequence goes from step S105 to step S106.

At step S106, the field division with regard to the detected search mark is made. The field division is such a processing in which, as illustrated in the part (d) of FIG. 4, four zones 34LU, 34LD, 34RD and 34RU are defined around a search mark 31 so that an image data is detected with regard to each zone. After the field division, at step S107 template matching is made for each zone and in respect to the position index mark or marks 32 of the detected search mark 31. When at step S108 the template matching in regard to every one of the four zones is completed, the sequence goes to step S109 whereat discrimination of the detected search mark 31 (i.e. which one of the marks 31LU - 31RD of FIG. 3 is caught by the CCD camera 12) as well as calculation of a positional deviation between a reticle alignment mark 16X (16Y) and a reticle setting mark 17X (17Y), based on the positional information which the discriminated search mark bears, are made. The discrimination can be performed on the basis of the location of the index element mark 32, and more particularly, by detecting such zone, of the four zones, in which the index element mark 32 exists. In the case of FIG. 4, part (b), for example, two index element marks 32 exist in the zones 34LU and 34RU, respectively. As a result, it is possible to determine that an associated search mark 31 as detected is the mark 31CD (FIG. 3) which is located at the middle of a lower side of the reticle alignment marks 16X and 16Y as viewed in this Figure. Additionally, since the positional relationship between the reticle alignment mark 16X (16Y) and the search mark 31CD is predetermined, by using corresponding positional information it is possible to calculate the amount of deviation between the reticle setting mark 17X (17Y) and the reticle alignment mark 16X (16Y).

Subsequently, in accordance with the calculated positional deviation, the reticle stage 24 is moved by means of the reticle stage driving circuit 23 (step S110) to execute coarse alignment. Then, at step S111, the image pickup is made again. As a result, a picture as illustrated in the part (c) of FIG. 4, for example, is taken. With the coarse alignment at the step S110, the reticle alignment marks 16X and 16Y as well as the reticle setting marks 17X and 17Y can be surely captured within a single picture plane 33.

Further, for fine alignment of these marks, at step S112 the parameters for use in the discrimination of these marks (e.g. for setting a slice level for the binary-coding of the outputs from the picture elements or pixels of the CCD camera 12) are calculated. Also, at step S113, the center of the reticle alignment mark 16X in the X direction and the center of the mark 16Y in the Y direction as well as the center of the reticle setting mark 17X in the X direction and the center of the mark 17Y in the Y direction are detected. Subsequently, any deviation between the mark centers is calculated (Step S114) and then, at step S115, discrimination is made as to whether the calculated deviation is not greater than a predetermined tolerance. If the deviation is greater than the tolerance, the reticle stage 24 is displaced by the reticle stage driving circuit 23 (step S116) to execute fine alignment. Then, the sequence goes back to step S111 and the above-described operations are repeated. If the deviation is not greater than the tolerance (step S115), the alignment of the reticle 1 is accomplished.

Figure 6A:
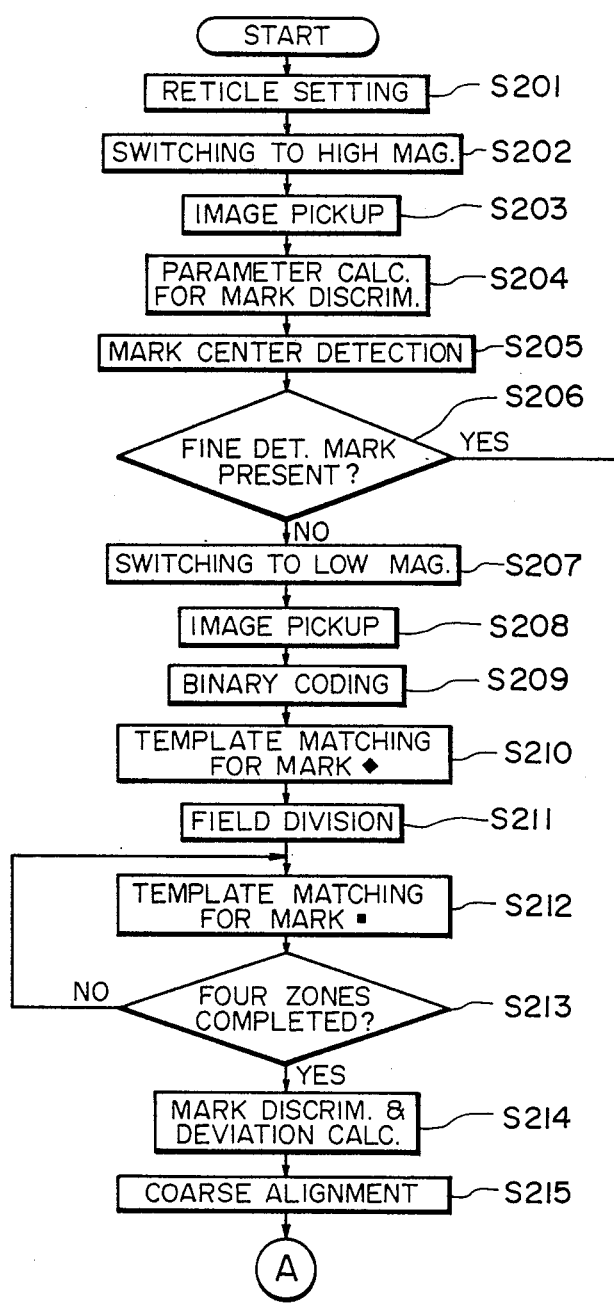
FIG. 6 is a flow chart for explicating the procedure of mark detection where the magnification of an erector is interchanged between a high magnification and a low magnification.
Figure 6:
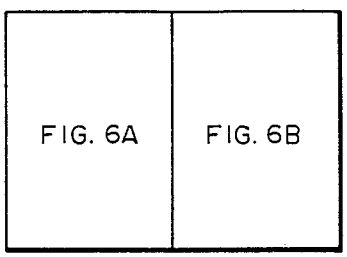
Figure 6B:
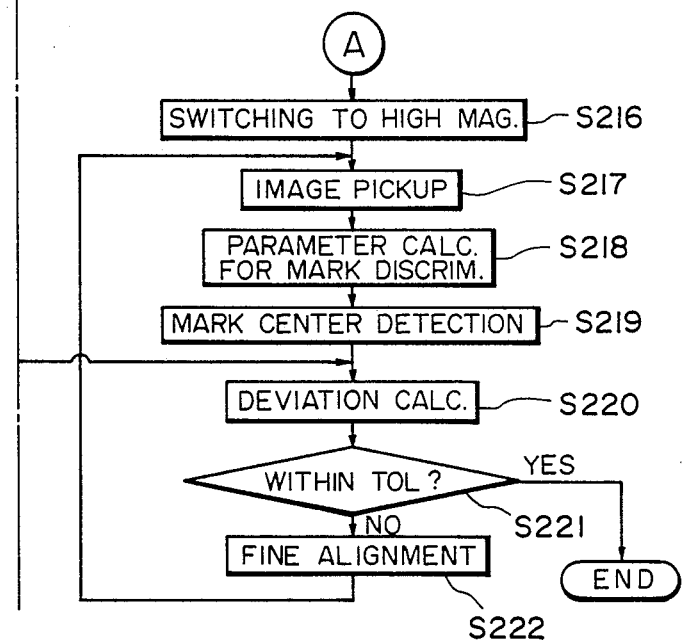

Referring now to the flow chart of FIG. 6, a description will be provided of the procedure in an example where the magnification changeable erector 15 of the FIG. 1 apparatus is used to change the magnification of the CCD camera 12. The structure of the apparatus (FIGS. 1 and 2) and the configuration of each mark (FIG. 3) are the same as those of the foregoing example.

First, upon start of the process, a reticle 1 is placed on the reticle stage 24 (step S201). Subsequently, at step S202, the magnification of the magnification changeable erector 15 is set to its higher magnification and, at step S203, the image pickup is made by the CCD camera 12 with the cooperation of the optical system shown in FIG. 1. Thereafter, at steps S204 and S205, calculation of mark discrimination parameters and detection of the center of each mark, similar to those made at steps S112 and S113 in FIG. 5, are made. If, as a result of these operations, the reticle alignment marks 16X and 16Y and the reticle setting marks 17X and 17Y (which are those to be detected) are caught by the high-magnification image pickup (step S206), calculation of any positional deviation is possible by using the obtained data and, therefore, the sequence blanches to step S220. If these marks are not detected, the sequence goes to step S207.

At step S207, the magnification of the erector 15 is changed to its lower magnification and, at step S208, the image pickup is made. The processing to be made in the succeeding steps S209–S215 are similar to those made in the steps S103–S110 in FIG. 5. In this occasion, however, from the discrimination made at step S206 it is apparent that the reticle alignment marks 16X and 16Y have not been picked up by the camera but a reticle search mark 31 is picked up. Therefore, discrimination of the presence/absence of a search mark at step S105 in FIG. 5 is not necessary and is omitted.

At the time of completion of coarse alignment (step S215), the CCD camera 12 captures in a single picture plane the reticle alignment marks 16X and 16Y as well as the reticle setting marks 17X and 17Y.

Next, at step S216 the magnification of the erector 15 is changed to the higher magnification and, at step S217, the image pickup is executed. As a result, a picture such as illustrated in the part (d) of FIG. 4, for example, is taken. The processing to be made in the succeeding steps S218–S222 are similar to those made at steps S112–S116 in FIG. 5. Since, however, in this occasion such an image data as obtained by use of a higher magnification is used, the alignment can be made with higher precision.

While in the foregoing embodiment eight reticle search marks 31 (second marks) such as illustrated in FIG. 3 are used, the number or position of them may be changed as desired. What is required is that they function as search marks and that the positional relationship with the reticle alignment mark (first mark) can be detected on the basis of the positional information which each of these marks bears. Provided that such conditions are satisfied, any other mark or marks are usable. It will be understood that with a system in which magnification is changeable between a lower magnification and a higher magnification as in the FIG. 6 example, when the lower magnification is set it is possible to search a mark in a wider viewfield. Therefore, a reduced number of marks can be used.

Also, while the foregoing description has been made in the case where the mark detecting method and apparatus of the present invention is applied to the alignment of a reticle in a semiconductor device manufacturing exposure apparatus, the present invention is of course applicable to the alignment of a wafer. Namely, by preparatorily providing one or more search marks around an alignment mark of a wafer, the throughput in respect to the wafer prealignment can be improved.

Figure 7:
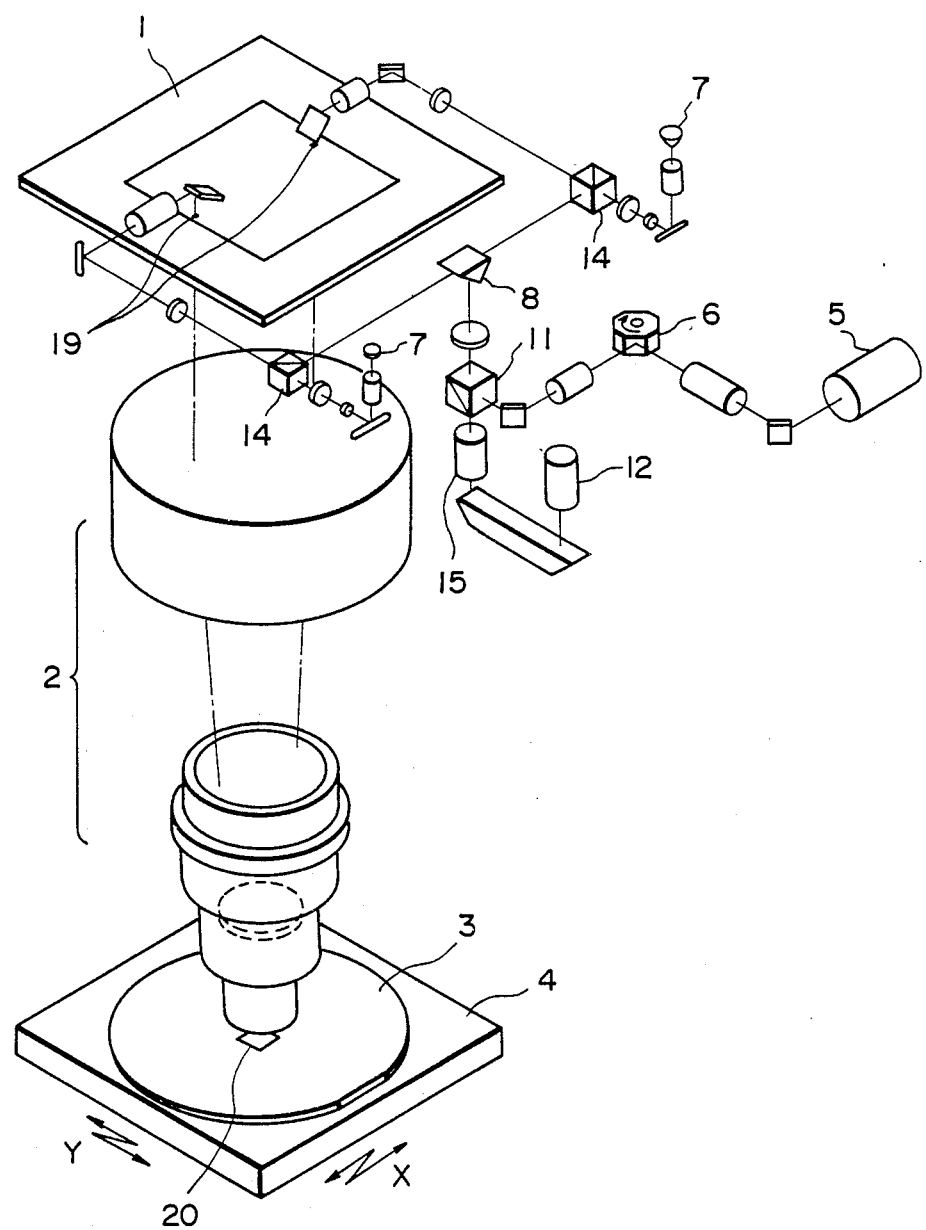
FIG. 7 is a schematic view showing an optical arrangement, in the case where the present invention is applied to the alignment of a wafer.
Figure 8:
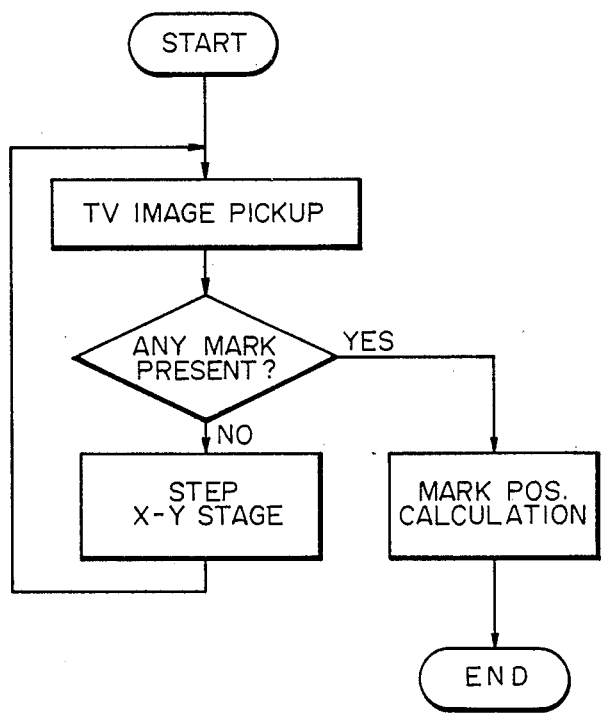
FIG. 8 is a flow chart for explicating the manner of conventional mark detection.

FIG. 7 illustrates an optical arrangement in which the present invention is applied to what is called TTL (Through-The-Lens) type wafer alignment in which alignment is made through a projection lens system 2. While the structure is substantially the same as that of the FIG. 1 embodiment, in this example the device is used to observe and align marks 19 on a reticle side and marks 20 on a wafer side. The reticle 1 is held immovable and, while observing through the CCD camera 12, the X-Y stage 4 is displaced to accomplish the alignment. Only the provision of search marks 31 with index element marks 32 (as depicted in FIG. 3) around each mark 20 of the wafer, allows execution of the alignment in a similar procedure as having been described with reference to FIG. 5 or 6.

Further, the concept of the present invention is applicable to the wafer prealignment using one or more objective lenses of off-axis type. Substantially the same advantageous effects are attainable.

In accordance with the present invention, as described hereinbefore, an alignment mark (first mark) as well as one or more marks (second marks) each bearing positional information concerning the alignment mark, are provided in a region in which the search can be made. When the second mark is detected, the first mark is detectable on the basis of the positional information which the second mark bears. As a result, the necessity of a mark searching drive, as in the conventional mark detecting devices, can be avoided with an advantageous result of improvements in the throughput in respect to the mark detection.

While the invention has been described with reference to the structures disclosed herein, it is not confined to the details set forth and this application is intended to cover such modifications or changes as may come within the purposes of the improvements or the scope of the following claims.

What is claimed is:

1. A mark detecting method for alignment of an object with respect to a predetermined position, said method comprising the steps of:
   providing, on the object, an alignment mark usable for the alignment of the object with respect to said predetermined position and an index mark indicative of the position of the alignment mark on the object;
   placing the object on a stage;
   forming an image of a portion of the object by use of image pickup means and an associated optical system, and discriminating, by use of an image signal from the image pickup means, whether the index mark is present within an image pickup region of the image pickup means;
   detecting the position of the alignment mark as indicated by the index mark, by use of calculating means and the image signal from the image pickup means, when the presence of the index mark within the image pickup region is discriminated;
   moving the stage by use of stage driving means, on the basis of information indicative of the position of the alignment mark as detected by the calculating means; and
   forming an image of the alignment mark, positioned in a desired portion of the image pickup region as a result of the movement of the stage, by use of the image pickup means and the optical system, for aligning the object with respect to said predetermined position.

2. A method according to claim 1, wherein the optical system has a variable imaging magnification which is set higher for the image pickup of the alignment mark by the image pickup means, than for the image pickup of the index mark by the image pickup means, said forming steps comprising the steps of magnifying the image of the index mark and the alignment mark using the optical system, said alignment mark being magnified to a greater extent than the index mark.

3. A method according to claim 1, wherein said providing step comprises the step of providing a plurality of index marks in association with the alignment mark.

4. A method according to claim 3, wherein said providing step comprises the step of providing the index marks two-dimensionally around the alignment mark.

5. A method according to claim 3, wherein said providing step further comprises the step of providing index marks having first patterns of the same configuration and second patterns different in number and/or position from the first patterns.

6. A method according to claim 5, wherein said forming and discriminating steps further comprise the step of discriminating the presence/absence of the index mark within the image pickup region on the basis of template matching by use of the image signal from the image pickup means.

7. A mark detecting method, comprising the steps of:
   providing on an object an alignment mark to be brought into a predetermined positional relationship with a reference mark, and an index mark indicative of the position of the alignment mark;
   placing the object on a stage;
   forming an image of a portion of the object by use of image pickup means and an associated optical system;
   discriminating, by use of an image signal from the image pickup means, whether the index mark is present within an image pickup region of the image pickup means;
   detecting the position of the alignment mark as indicated by the index mark, by use of calculating means and the image signal from the image pickup means, when the presence of the index mark within the image pickup region is discriminated;
   moving the stage by use of stage driving means, on the basis of information indicative of the position of the alignment mark as detected by the calculating means; and
   forming, by use of the image pickup means and the optical system, an image of the reference mark and the alignment mark positioned, by the movement of the stage, in a desired portion of the image pickup region which portion is related to the reference mark, so as to bring the alignment mark into the predetermined positional relationship with the reference mark.

8. A method according to claim 7, wherein the optical system has a variable imaging magnification which is set higher for the image pickup of the alignment mark by the image pickup means, than for the image pickup of the index mark by the image pickup means, said forming steps comprising the steps of magnifying the image of the index mark and the alignment mark using the optical system, said alignment mark being magnified to a greater extent than the index mark.

9. A method according to claim 7, wherein said providing step comprises the step of providing a plurality of index marks in association with the alignment mark.

10. A method according to claim 9, wherein said providing step comprises the step of providing the index marks two-dimensionally around the alignment mark.

11. A method according to claim 9, wherein said providing step further comprises the step of providing index marks having first patterns of the same configuration and second patterns different in number and/or position from the first patterns.

12. A method according to claim 11, wherein said forming and discriminating steps further comprise the step of discriminating the presence/absence of the index mark within the image pickup region on the basis of template matching by use of the image signal from the image pickup means.

13. A mark detecting device, comprising:
- a stage for carrying thereon an object having an alignment mark to be brought into a predetermined positional relationship with a reference mark, and an index mark indicative of the position of the alignment mark;
- image pickup means for forming, through an optical system, an image of a portion of the object placed on said stage;
- detecting means operable to discriminate, after the object is placed on said stage and by use of an image signal from said image pickup means, whether the index mark is present within an image pickup region of said image pickup means and also to detect the position of the alignment mark as indicated by the index mark, by use of the image signal from said image pickup means, when the presence of the index mark within the image pickup region of said image pickup means is discriminated; and
- stage driving means operable to move said stage on the basis of information indicative of the position of the alignment mark as detected by said detecting means, to position the alignment mark in a desired portion of the image pickup region which portion is related to the reference mark;
- wherein said image pickup means is operable to form, through said optical system, an image of the reference mark and the alignment mark positioned in said desired portion, for bringing the alignment mark into a predetermined positional relationship with the reference mark.

14. A reticle usable for printing a pattern on a semiconductor wafer, comprising:
- a base member;
- an alignment mark provided on said base member and being adapted so that an image thereof is formed by image pickup means for alignment of said reticle with a predetermined position;
- a search mark provided on said base member and being disposed so that said search mark is located within an image pickup region of said image pickup means when the alignment mark is not located in a predetermined portion of the image pickup region of said image pickup means; and
- an information mark provided in a portion of said base member adjacent to said search mark and having positional information related to the position of the alignment mark on said base member, said information mark being disposed so that said information mark is located within the image pickup region of said image pickup means when the search mark is located within the image pickup region of said image pick means.

15. A reticle according to claim 14, further comprising plurality of search marks provided in relation to the alignment mark.

* * * * *

UNITED STATES PATENT AND TRADEMARK OFFICE
CERTIFICATE OF CORRECTION

PATENT NO. : 4,962,423

DATED : October 9, 1990

INVENTOR(S) : YUICHI YAMADA, ET AL.

It is certified that error appears in the above-identified patent and that said Letters Patent is hereby corrected as shown below:

COLUMN 6

Line 5, "blanches" should read --branches--.

COLUMN 10

Line 26, "image pick means" should read --image pickup means--.

Signed and Sealed this

Twenty-fifth Day of August, 1992

*Attest:*

DOUGLAS B. COMER

*Attesting Officer*  *Acting Commissioner of Patents and Trademarks*